(12) United States Patent
Hu

(10) Patent No.: US 10,734,274 B2
(45) Date of Patent: Aug. 4, 2020

(54) METHOD OF SEPARATING THE MAIN PART OF A SEMICONDUCTOR SUBSTRATE FROM THE FUNCTIONAL LAYER BUILT ON IT

(71) Applicant: Bing Hu, Dallas, TX (US)

(72) Inventor: Bing Hu, Dallas, TX (US)

( * ) Notice: Subject to any disclaimer, the term of this patent is extended or adjusted under 35 U.S.C. 154(b) by 0 days.

(21) Appl. No.: 15/868,300

(22) Filed: Jan. 11, 2018

(65) Prior Publication Data

US 2018/0158720 A1 Jun. 7, 2018

Related U.S. Application Data

(63) Continuation of application No. PCT/CN2016/098943, filed on Sep. 14, 2016.

(30) Foreign Application Priority Data

Sep. 18, 2015 (CN) .......................... 2015 1 0599390

(51) Int. Cl.
*H01L 21/762* (2006.01)
*H01L 21/02* (2006.01)
(Continued)

(52) U.S. Cl.
CPC .... *H01L 21/76254* (2013.01); *H01L 21/0262* (2013.01); *H01L 21/02631* (2013.01);
(Continued)

(58) Field of Classification Search
CPC ........... H01L 21/76254; H01L 21/0262; H01L 21/02631; H01L 21/762; H01L 21/0254; H01L 29/45; H01L 29/47
See application file for complete search history.

(56) References Cited

U.S. PATENT DOCUMENTS 5,374,564 A 12/1994 Bruel
6,540,827 B1 4/2003 Levy et al.
(Continued)

FOREIGN PATENT DOCUMENTS

CN 101106067 A 1/2008
EP 1361298 12/2003
(Continued)

OTHER PUBLICATIONS

Tauzin, "Transfer of Two-Inch GaN Film by the Smart Cut Technology," 207th ECS Meeting, 1 page.
(Continued)

*Primary Examiner* — Mohammed R Alam
(74) *Attorney, Agent, or Firm* — Chad Peterson

(57) ABSTRACT

A process separates a main body of a semiconductor substrate from a functional layer. The method includes the steps of implanting ions into a semiconductor substrate through a top surface of the semiconductor substrate to form an ion damage layer underneath the top surface of the semiconductor substrate. After the ions are implanted into the semiconductor substrate, a functional layer is formed on the top surface of the semiconductor substrate. The main body of the semiconductor substrate is then separated from the functional layer. The method also includes forming the functional layer on the semiconductor substrate after ion implanting and then separating the functional layer from the main body of the substrate at the ion damage layer. This method avoids bonding in SOI and can thus reduce process steps and cost.

18 Claims, 8 Drawing Sheets

(51) Int. Cl.
H01L 29/45 (2006.01)
H01L 29/47 (2006.01)

(52) U.S. Cl.
CPC ........ H01L 21/762 (2013.01); *H01L 21/0254* (2013.01); *H01L 29/45* (2013.01); *H01L 29/47* (2013.01)

(56) References Cited

U.S. PATENT DOCUMENTS

| | | | |
|---|---|---|---|
| 2005/0227456 | A1 | 10/2005 | Roche |
| 2007/0249140 | A1 | 10/2007 | Dross et al. |
| 2008/0169508 | A1 | 7/2008 | Chidambarrao et al. |
| 2009/0035885 | A1 | 2/2009 | Karlicek, Jr. et al. |
| 2009/0071394 | A1* | 3/2009 | Nakahata ............. C30B 25/02 117/2 |
| 2010/0109126 | A1 | 5/2010 | Arena |
| 2010/0311250 | A1 | 12/2010 | Bedell et al. |
| 2011/0156212 | A1 | 6/2011 | Arena |
| 2011/0244654 | A1 | 10/2011 | Akijama et al. |
| 2012/0119219 | A1* | 5/2012 | Takado ............. H01L 21/02579 257/76 |
| 2012/0326169 | A1* | 12/2012 | Sakai ................ B82Y 20/00 257/79 |
| 2014/0252366 | A1* | 9/2014 | Gao .................. H01L 29/2003 257/76 |
| 2014/0327013 | A1* | 11/2014 | Schenk ............. H01L 21/02381 257/76 |
| 2018/0350785 | A1 | 12/2018 | Fong et al. |

FOREIGN PATENT DOCUMENTS

| | | |
|---|---|---|
| JP | 2002-241191 | 8/2002 |
| JP | 2011-249775 | 12/2011 |

OTHER PUBLICATIONS

Di Cioccio, "Silicon carbide on insulator formation using the Smart Cut process," Electronics Letters vol. 32 No. 12 (Jun. 6, 1996), pp. 1144-1145.
Larheche, "AlGaN I GaN HEMT structures grown on SiCOI wafers obtained by the Smart Cut™ technology," Materials Science Forum vols. 457-460 (2004), pp. 1621-1624.
Henttinen, "Transfer of Thin Si Layers by Cold and Thermal Ion-Cutting," Journal of Material Science: Materials in Electronics vol. 14 (2003), pp. 299-303.
Bouchard, "Analysis of stress intensity factors and T-stress to control crack propagation for kerf-less spalling of single crystal silicon foils," Computational Materials Science 69 (Mar. 2013), pp. 243-250.
Martini, "Epoxy-induced spalling of Silicon," Energy Procedia 27 (2012), pp. 567-572.
Bedell, "Kerf-Less Removal of Si, Ge, and III-V Layers by Controlled Spalling to Enable Low-Cost PV Technologies," IEEE Journal of Photovoltaics vol. 2 No. 2 (Apr. 2012), pp. 141-147.
Niepelt, "Kerfless exfoliated thin crystalline Si wafers with Al metallization layers for solar cells," Journal of Materials Research Nov. 2015, 36 pages.
Bedell, "Layer transfer by controlled spalling," Journal of Physics D Applied Physics 46 (Mar. 2013), 8 pages.
Bedell, "Vertical Light-Emitting Diode Fabrication by Controlled Spalling," Applied Physics Express 6 (2013), 4 pages.
Written Opinion of the International Searching Authority for PCT/CN2016/098943 (Translation); dated Dec. 19, 2016; 5 pages.
International Search Report for PCT/CN2016/098943 (Translation); dated Dec. 19, 2016; 3 pages.
Budde, "Hydrogen-Related Defects in Proton-Implanted Silicon and Germanium," Thesis, Institute of Physics and Astronomy, University of Aarhus, Denmark (Oct. 1998), 159 pages.
Amarasinghe, "Optimization of H+ Implantation Parameters for Exfoliation of 4H—SiC Films," ECS Transactions (Mar. 2013), pp. 341-348.
Goorsky (Ed.), "Ion Implantation," InTech (2012), Rijeka, Croatia, 448 pages.
Communication from European Patent Office re EP16845712, dated Mar. 20, 2019; 6 pages.
Notification of Reasons for Refusal from Japanese Patent Office re 2018-524527 (Translation), dated Jan. 8, 2019, 3 pages.
Communication from Japanese patent office, dated May 22, 2019, 4 pages.
Communication from German patent office, dated Jul. 22, 2019, 7 pages.
Office Action re U.S. Appl. No. 16/201,821.
Communication from Korean patent office, dated Jun. 5, 2020, 6 pages (with translation).

* cited by examiner

METHOD OF SEPARATING THE MAIN PART OF A SEMICONDUCTOR SUBSTRATE FROM THE FUNCTIONAL LAYER BUILT ON IT

CROSS-REFERENCE TO RELATED APPLICATIONS

This Application is a continuation of International Application No. PCT/CN2016/098943 filed Sep. 14, 2016, which claims priority to Chinese Application No. 201510599390 filed in Sep. 18, 2015. The disclosures of these applications including the specifications, the drawings, and the claims are hereby incorporated by reference in their entirety.

TECHNICAL FIELD

The present disclosure is related to the field of manufacturing electronic devices, and in particular, to separating an upper functional layer from a main body of a semiconductor substrate.

BACKGROUND

Semiconductor materials are widely used for making electronic devices. The applications of semiconductor materials are directly related to our daily lives and in technology. Semiconductor materials have evolved from silicon or germanium (for example) in the first generation to more recent third generation materials such as silicon carbide (SiC) and gallium nitride (GaN). All electronic devices based on semiconductors are built on semiconductor substrates, and the pricing of electronic devices is a function of the cost of substrates. Generally, the first and second generation semiconductor substrates are grown from their respective melt, while the third generation semiconductor substrates are mostly grown from vapors, such as chemical vapor deposition (CVD), metalorganic chemical vapor deposition (MOCVD), physical vapor transport (PVT), hydride vapor phase epitaxy (HVPE), and such. The substrate costs of third generation semiconductor are much higher than in previous generations. As such, reducing the cost of substrates will benefit consumers of electronic devices, and prompt more applications, especially those based on the 3rd generation semiconductors.

Ion cut (i.e. smart-cut) technique was developed for producing silicon-on-insulator (SOI) wafer substrates in the 1990s. The ion cut actually includes ion cut and film transfer, using ion implantation to separate a film layer from its main substrate. The SOI fabrication process includes first forming a silicon dioxide film with thickness in the order of a few micro-meters on the donor silicon substrate. Next, hydrogen ions are implanted into the silicon substrate through the silicon dioxide to reach the silicon substrate and stays in the silicon substrate, which cause an ion damage layer in silicon. The depth of ion damage layer under surface is determined by the ion acceleration voltage. That is, the higher the acceleration volts, the deeper the ions can travel into the substrate. The depth of the ion damage layer under the surface of the silicon substrate usually ranges from a micrometer to twenty some micrometers. A bonding process follows the ion implantation step, in which an acceptor silicon substrate is bonded to the donor silicon substrate on the silicon dioxide surface. Bonded substrates are then annealed at temperatures of 200-500° C. The hydrogen ions in ion damage layer agglomerate into hydrogen gas during the annealing. The hydrogen gas extends along the ion damage layer and causes the separation of the donor substrate from acceptor substrate at the ion damage layer. The donor wafer can then be reused. The acceptor wafer undergoes further heat annealing to rearrange the silicon atoms on the separate surface. The surface atom rearrangement eliminates the ion damage. A silicon film of a few micrometers in thickness lies above the silicon dioxide layer. Electronic devices can then be built on this silicon film. The acceptor substrate only supports the silicon film and silicon dioxide layers above it. The acceptor substrate, with Si film and SiO2 layer on it, is the SOI substrate. The ion cut technique has also been attempted on other semiconductor materials to transfer film. To reduce substrate cost for SiC and GaN, great efforts were made to transfer SiC and GaN film to Si or oxide substrates by means of ion cut. In contrast from the SOI process, there is no requirement to form an oxide layer on GaN or SiC, because they are usually transferred on insulators. In the ion cut process, there are some important factors such as implanted ion dosage, depth of implanted ions, bonding of acceptor substrate to donor substrate, and annealing after bonding. Among these factors, bonding of the acceptor substrate to the donor substrate is critical to the success of ion cut and film transfer. If donor and acceptor wafers are not bonded very well, the film to be transferred can be broken during annealing or separation due to lack of support from the acceptor wafer. To achieve satisfactory bonding, the bonding surface of substrates must be very flat. Getting the surface of SiC substrate to meet the bonding requirements is very challenging because of the hardness of SiC. In addition, the separated surface in a normal ion cut process needs a further process like heat annealing or polishing to repair damage to the surface and to allow electronic devices to be formed thereon.

In last a few years Stephen W. Bedell, et. al., successfully separated Si, Ge, GaAs, and GaN films from their respective substrates by means of a controlled spalling. The process of controlled spalling includes first coating a stress inducing layer on top of a semiconductor substrate first, and then putting a tape on the stress inducing layer. By pulling the tape, a film of substrate attached to the stress inducing layer is separated from the main body of the substrate. The thickness of the film that is separated from the substrate is controlled by stress in the stress inducing layer. This thickness control method may cause difficulty in large scale production. Furthermore, there is no reported application of controlled spalling on hard substrate materials such as SiC although it can be done theoretically.

SUMMARY

This patent is to solve the complexity and difficulties that a conventional ion cut may have, i.e. effected by depth of ion implantation, ion dose in a unit area, and bonding strength between acceptor and donor substrates, especially on some hard substrate substrates such as SiC and such. Furthermore, the embodiments of the present disclosure will be easier for large scale production and may yield fewer defects caused by separation compared to controlled spalling.

According to an embodiment, a process separates the main part of a semiconductor substrate from the functional layer built on it using the following steps:

Step 1. Implant ions into a semiconductor substrate through a top surface of the semiconductor substrate to form an ion damage layer in the semiconductor substrate. According to an embodiment, the implanted ions may be located at a depth in the range from 0.1 μm to 100 μm underneath the top surface of the semiconductor substrate.

Step 2. Form a function layer on the top surface of the semiconductor substrate after the ions are implanted into the semiconductor substrate.

Step 3. Separate the main part of the semiconductor substrate and the function layer at ion damage layer.

The benefits of embodiments in the present disclosure are: The electronic devices or functional layers are directly built onto the substrates that are ion implanted and then are separated from the substrates at the ion damage layer. This avoids the re-treatment of the defects that are created on the separated surface by normal ion-cut processes because the functional layer (with or without electronic devices) is built on the original surface of a substrate. Since the ion energy determines distance of ions penetrate into the substrate, the film separated from the substrate by the method in this patent has similar effect of SOI but needs no bonding process. It simplifies the process and reduces production cost. Furthermore, the functional layer or the electronic devices in embodiments of the present disclosure are built on the original surface of the substrate rather than on the separated surface as done in prior art normal ion-cut, as the separated surface in the prior art normal ion-cut process either needs re-polishing or heat annealing to eliminate ion damage or defects caused by separation. The ion doses in prior art normal ion-cut processes are usually more than the dose that cause gas bubble on surface without stiffer. However, the ion dose in embodiments of the present disclosure requires no gas bubbles damage to appear on the surface of the substrate.

According to an embodiment, the semiconductor substrate may be any of a mono-crystalline semiconductor, a mono-crystalline semiconductor with an epitaxial semiconductor layer grown on it, or a mono-crystalline oxide with an epitaxial semiconductor layer grown on it.

According to an embodiment, the semiconductor substrate material is at least one of Si, Ge, $Si_xGe_{1-x}$, SiC, GaAs, InP, $In_xGa_{1-x}$As, CaTe, AlN, GaN, InN, or $Al_xIn_yGa_{1-x-y}N$, among them x and y follows: $0 \leq x \leq 1$, $0 \leq y \leq 1$, $0 \leq 1-x-y \leq 1$.

According to an embodiment, forming the functional layer includes fabricating electronic devices directly on the top surface of the semiconductor substrate, growing an epitaxial semiconductor layer on the top surface of the semiconductor substrate, or first growing the epitaxial layer on the top surface of the semiconductor substrate and then fabricating electronic devices on the epitaxial layer.

According to an embodiment, the epitaxial semiconductor layer composition includes at least one of Si, Ge, $Si_xGe_{1-x}$, SiC, GaAs, InP, $In_xGa_{1-x}P$, $In_xGa_{1-x}As$, CaTe, AlN, GaN, InN, or $Al_xIn_yGa_{1-x-y}N$, wherein $0 \leq x \leq 1$, $0 \leq y \leq 1$, and $0 \leq 1-y \leq 1$.

According to an embodiment, the x and the y may vary gradually or abruptly in the epitaxial layer $Al_xIn_yGa_{1-x-y}N$.

According to an embodiment, the epitaxial layer may be deposited by one of chemical vapor deposition (CVD), plasma enhanced chemical vapor deposition (PECVD), metalorganic chemical vapor deposition (MOCVD), molecular beam epitaxy (MBE), hydrid vapor phase epitaxy (HVPE), physical vapor transport (PVT) and liquid phase epitaxy (LPE).

According to an embodiment, the ions that implant into the semiconductor substrate are at least one of the ions from elements H, He, Ar, or Ne, or the ions from their gas.

According to an embodiment, the process further includes forming a stress inducing layer above the functional layer, the stress inducing layer being tensile stressed and introducing compressive stress to the functional layer.

According to an embodiment, the stress inducing layer is composed of metal materials including at least one of: Ni, Au, Cu, Pd, Ag, Al, Sn, Cr, Ti, Mn, Co, Zn, Mo, W, Zr, V, Ir, Pt and Fe.

According to an embodiment, the stress layer can be polymers.

According to an embodiment, the metal stress inducing layer can function as a Schottky contact layer or an ohmic contact layer when the stress inducing layer is metallic.

According to an embodiment, the process further includes forming a stiff or soft supporting layer on the stress inducing layer.

According to an embodiment, the process further includes forming a stiff or soft supporting layer on the functional layer.

DETAILED DESCRIPTION

Figure 1:
FIG. 1 is a schematic cross-sectional illustration of a semiconductor substrate, in accordance with an embodiment of the present disclosure.

While the present disclosure is described herein by way of example using embodiments and illustrative drawings, those skilled in the art will recognize that the disclosure is not limited to the embodiments of drawing or drawings described, and are not intended to represent the scale of the various components. Further, some components that may form a part of the disclosure may not be illustrated in certain figures, for ease of illustration, and such omissions do not limit the embodiments outlined in any way. It should be understood that the drawings and detailed description thereto are not intended to limit the disclosure to the particular form disclosed, but on the contrary, the disclosure is to cover all modifications, equivalents, and alternatives falling within the scope of the present disclosure as defined by the appended claims. As used throughout this description, the word "may" is used in a permissive sense (i.e. meaning having the potential to), rather than the mandatory sense, (i.e. meaning must). Furthermore, the terminology and phraseology used herein is solely used for descriptive purposes and should not be construed as limiting in scope. Language such as "including," "comprising," "having," "containing," or "involving," and variations thereof, is intended to be broad and encompass the subject matter listed thereafter, equivalents, and additional subject matter not recited, and is not intended to exclude other additives, components, integers or steps. Likewise, the term "comprising" is considered synonymous with the terms "including" or "containing" for applicable legal purposes. Any discussion of documents, acts, materials, devices, articles and the like is included in the specification solely for the purpose of providing a context for the present disclosure. It is not suggested or represented that any or all of these matters form part of the prior art base or were common general knowledge in the field relevant to the present disclosure.

In this disclosure, whenever a composition or an element or a group of elements is preceded with the transitional phrase "comprising", it is understood that we also contemplate the same composition, element or group of elements with transitional phrases "consisting of", "consisting", "selected from the group of consisting of, "including", or "is" preceding the recitation of the composition, element or group of elements and vice versa.

The present disclosure is described hereinafter by various embodiments with reference to the accompanying drawing, wherein reference numerals used in the accompanying drawing correspond to the like elements throughout the description. This disclosure may, however, be embodied in many different forms and should not be construed as being limited to the embodiments set forth herein. Rather, the embodiments are provided such that this disclosure will be thorough and complete and will fully convey the scope of the disclosure to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary and are not intended to limit the scope of the disclosure.

Compared to the controlled spalling technique previously discussed, embodiments described below allow controlling the thickness of the film to be separated from the substrate by means of ion implantation and the stress in the stress-inducing layer does not need to be precisely controlled, which makes good for large scale production. The embodiments of the present disclosure have no need of using tape on the stress inducing layer. The stress inducing layer may be thicker than that used in controlled spalling and provide support to the film. Furthermore, embodiments of the present disclosure may also be applied for separating hard semiconductor substrates like SiC. Another potential advantage of the embodiments of the present disclosure may be the fewer separation defects than from spalling techniques because the ion damage layer is introduced earlier.

The numbers in the figures represent each parts as follows:

1) semiconductor substrate; 2) the main body of semiconductor substrate; 3) ion damage layer; 4) substrate film; 5) epitaxial layer; 51) the first epitaxial layer; 52) the second epitaxial layer; 53) the third epitaxial layer; 54) the fourth epitaxial layer; 6) the stress inducing layer; 7) operation layer; and 8) stiff substrate.

The detailed description and drawings of the present disclosure are only for further explanations of the principles and specialties of the patent. They do not restrict the ranges of this patent therein.

Figure 2:
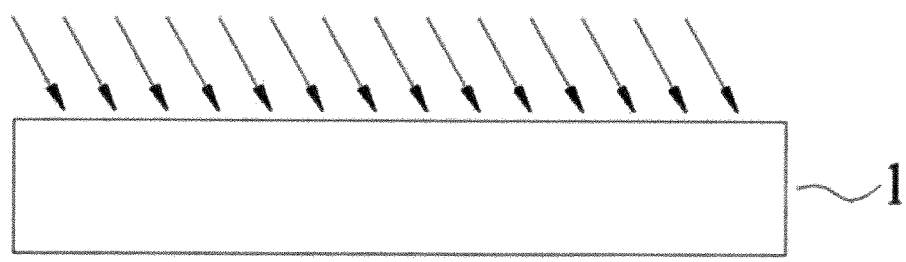
FIG. 2 is a schematic cross-sectional illustration of ions being implanted through a top surface of the semiconductor substrate, in accordance with an embodiment of the present disclosure.
Figure 3:
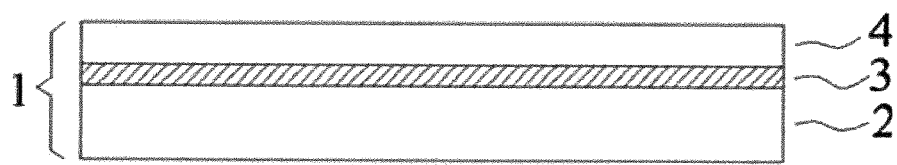
FIG. 3 is a schematic cross-sectional illustration of the semiconductor substrate with an ion damage layer after ion implantation, in accordance with an embodiment of the present disclosure.

FIG. 1 is a schematic cross-sectional illustration of a semiconductor substrate 1, in according to an embodiment of the present disclosure, and FIG. 2 is a schematic cross-sectional illustration of ions being implanted through a top surface of the semiconductor substrate 1, according to an embodiment of the present disclosure. FIG. 3 is a cross-sectional illustration of the semiconductor substrate with an ion damage layer after ion implantation, in accordance with an embodiment of the present disclosure. After ion implantation, the semiconductor substrate 1 is divided into layers, including: a main body 2, an ion damage layer 3 above the main body, and a substrate film 4 above the ion damage layer 3. According to an embodiment, the semiconductor substrate 1 may be a piece of a mono-crystalline semiconductor, a piece of a mono-crystalline semiconductor with an epitaxial semiconductor layer on it, or a piece of a mono-crystalline material other than a semiconductor including oxide with an epitaxial semiconductor layer on it. The ions are implanted through the surface of semiconductor substrate. The implanted ions include at least one of H, He, Ar, and Ne, or their gas ions.

According to an embodiment, ions are implanted through the top surface of semiconductor substrate 1. According to an embodiment, the ion implantation depth may range from 0.1 to 100 µm, preferably at 5 µm, 10 µm, 15 µm, or 20 µm. The implanted ions under the surface of the semiconductor substrate 1 form an ion damage layer 3. A functional layer may be directly formed on the substrate film 4. In this particular embodiment, the functional layer are electronic devices, such as MOS or MOSFET. A stiff substrate 8 may be adhesive on the electronic devices. The stiff substrate may be semiconductor, oxide crystal, metal, glass or ceramic materials. A pulling force is applied to separate the main body 2 of the semiconductor substrate from the substrate film 4 at the ion damage layer 3. The force applied for separation is much larger than there is with the stress inducing layer 6. The function layer may be partially finished electronic devices fabricated on substrate film 4 before separation. The rest of fabrication for electronic devices on substrate film 4 may be performed after separation.

According to another embodiment, ions may be implanted through the top surface of semiconductor substrate 1. The ion implantation depth may range from 0.5 to 50 µm, preferably at 5 µm, 10 µm, 15 µm, or 20 µm. The implanted ions under the surface of the semiconductor substrate 1 form an ion damage layer 3. The functional layer is formed on the surface of substrate film 4 through which the ions are implanted. The functional layer in this embodiment is either an epitaxial semiconductor layer 5 grown on the top surface of semiconductor substrate 1, or the epitaxial layer 5 with electronic devices fabricated thereon. The epitaxial semiconductor layer 5 may be formed by means of CVD, PECVD, MOCVD, MBE, HVPE, PVT or LPE.

According to an embodiment, the epitaxial semiconductor layer 5 may be a single structure or composed of multiple structures. The epitaxial semiconductor layer 5 may include at least one of Si, Ge, $Si_xGe_{1-x}$, SiC, GaAs, InP, $In_xGa_{1-x}As$, CaTe, AlN, GaN, InN, or $Al_xIn_yGa_{1-x-y}N$, where $0 \leq x \leq 1$, $0 \leq y \leq 1$, $0 \leq 1-x-y \leq 1$. According to an embodiment, x and y can vary gradually or abruptly in the epitaxial semiconductor layer of $Al_xIn_yGa_{1-x-y}N$. The conductivity and conductive type such as p or n type in epitaxial semiconductor layer 5 may be controlled by means of dopants. As shown in FIG.

5, the epitaxial semiconductor layer 5 may include the first epitaxial layer 51, the second epitaxial layer 52, the third epitaxial layer 53 and the fourth epi layer 54. Using a LED structure as one example, the first epitaxial layer 51 is AlN, the second epitaxial layer 52 is n-type GaN, the third epitaxial layer 53 includes multiple quantum wells $In_xGa_{1-x}N$ and barriers GaN (here $0 \leq x \leq 1$), and the fourth epitaxial layer 54 is p-type GaN. This is merely one example application of an epitaxial layer and is not meant to restrict the epitaxial structures and applications covered within the scope of the present disclosure.

Figure 6:
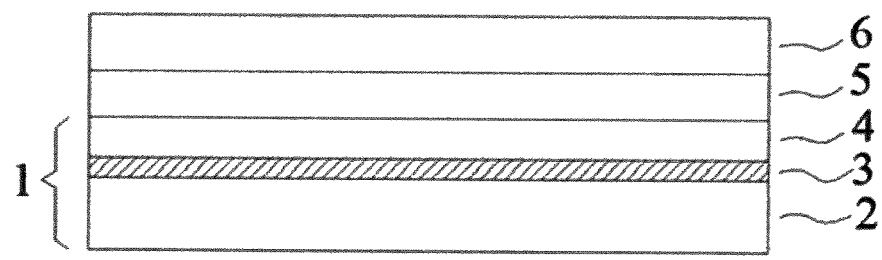
FIG. 6 is a schematic cross-sectional illustration of a stress inducing layer formed on the epitaxial layer, in accordance with an embodiment of the present disclosure.

According to an embodiment, the stress inducing layer 6 is formed on epitaxial semiconductor layer 5 as illustrated in FIG. 6. The stress inducing layer 6 is subjected to a tensile stress. According to an embodiment, the stress inducing layer 6 may be formed by means of vapor coating, sputtering, electroplating, brush coating, spin coating and such. According to an embodiment, the stress inducing layer 6 may be formed of metallic material, including at least one of Ni, Au, Cu, Pd, Ag, Al, Sn, Cr, Ti, Mn, Co, Zn, Mo, W, Zr, V, Pt, and Fe. The function of the stress inducing layer 6 is to introduce compressive stress in the functional layer (i.e., the epitaxial layer 5 in this embodiment) such that the main body 2 and the substrate film 4 can be separated. According to an embodiment, the stress inducing layer 6 may be composed of a non-metal polymer such as epoxy. The epoxy stress inducing layer may be baked and dried at 150° C. According to an embodiment, stress may be generated during cooling down to separate the functional layer from the main body 2 because the coefficients of thermal expansion of functional layer and stress inducing layer are different. Similarly, with room temperature dried epoxy stress inducing layer, reducing temperature to liquid nitrogen temperature has a similar separation effect. The stress inducing layer 6, when metallic, may also function as an Ohmic contact or Schottky contact layer when it is metallic. For example, the stress layer above p-GaN in LED structure may function as an Ohmic electrode while the stress inducing layer above n-type epitaxial layer for SiC diode can function as a Schottky contact layer.

Figure 7:
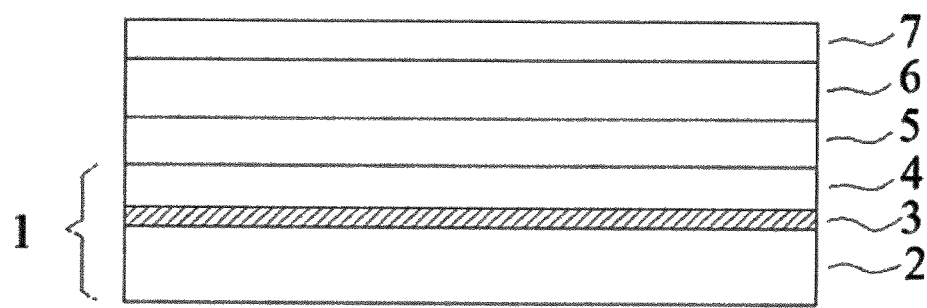
FIG. 7 is a schematic cross-sectional illustration of an operational layer formed on the stress inducing layer, in accordance with an embodiment of the present disclosure.
Figure 8:
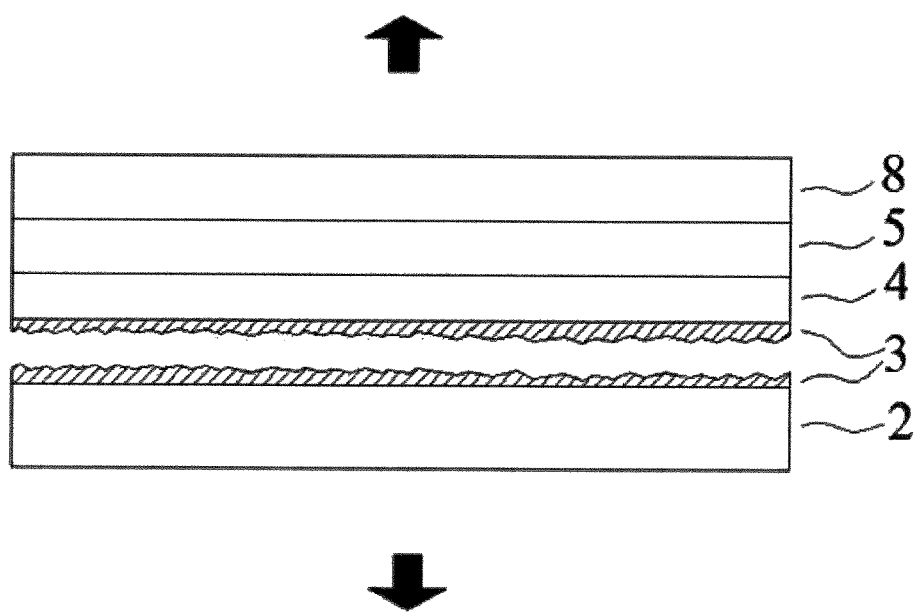
FIG. 8 is a schematic cross-sectional illustration of separating a functional layer from the main body of the substrate with a stiff substrate glued on the epitaxial layer, in accordance with an embodiment of the present disclosure.

FIG. 7 is a schematic cross-sectional illustration of an operational layer 7 formed on the stress inducing layer 6, in accordance with an embodiment of the present disclosure. According to an embodiment, the operational layer 7 is formed on stress inducing layer 6. The purpose of operational layer 7 is for convenient handling during separation. According to an embodiment, the operational layer 7 may be made of soft material such as tape or polymer, or stiff materials such as semiconductor, oxide, metal, glass or ceramics. According to an embodiment, the operational layer 7, which acts as a supporting layer when the stress inducing layer is too thin, is not needed depending on thickness of the stress inducing layer 6. FIG. 8 is a schematic cross-sectional illustration of separating a functional layer from the main body 2 of the substrate 1 with a stiff substrate 8 on the epitaxial layer 5, in accordance with an embodiment of the present disclosure. According to an embodiment, a stiff substrate 8 is adhesive on the functional layer. A pulling force is applied for separation. The arrows in FIG. 8 show the pulling directions.

Figure 5:
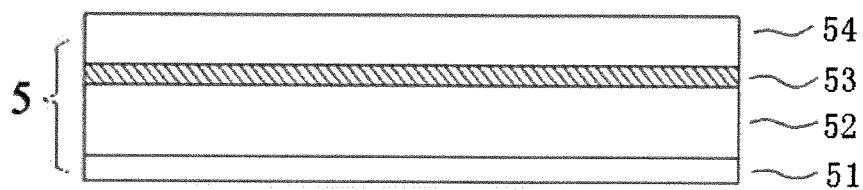
FIG. 5 is a schematic cross-sectional illustration of an epitaxial layer, in accordance with an embodiment of the present disclosure.

According to an embodiment, the semiconductor substrate 1 is silicon carbide (SiC). As an example, the substrate may be a 2" 6H poly type (0001) SiC substrate. Protons are implanted into the SiC substrate at a 7° incline with respect to the surface of the SiC substrate. The implanted proton energy is 400 keV. The ion dose is $5 \times 10^{16}$ cm$^{-2}$. The protons cause an ion damage layer 3 in the semiconductor substrate 1 as illustrated in FIG. 3. A suitable heat annealing will enhance the ion damage effect. The annealing temperatures are varied for different substrate materials. To a Si substrate the annealing temperature should be above 218° C. To a SiC substrate, the annealing temperature should be above 650° C. The heat annealing can occur during the process of forming the functional layer. The ion dose should be controlled based on ion energy such as to minimize or prevent surface damage caused by ion gas bubbles and/or spontaneous exfoliation of substrate film, which is the aim for successful application of the embodiments in the present disclosure. After ion implantation, the SiC substrates are placed into MOCVD reactors for epitaxial semiconductor layers (functional layer, in this case) as illustrated in FIG. 5. The epitaxial semiconductor layers 51-54 from bottom to top are AlN buffer layer, Si doped n-type GaN layer, multiple quantum wells $In_xGa_{1-x}N$ and barriers GaN, Mg doped p-type GaN layer, respectively. The total thickness of the epitaxial layer 5 in this embodiment is approximately 4 μm. A stress inducing layer of 10 μm Ni may be sputtered on the epitaxial layer 5. A 200-300 μm copper supporting layer and stress inducing layer is electroplated on Ni stress inducing layer. The main body 2 is thus separated from substrate film 4 and the functional layer on it. The main part of substrate can be re-used with re-polishing.

Figure 4:
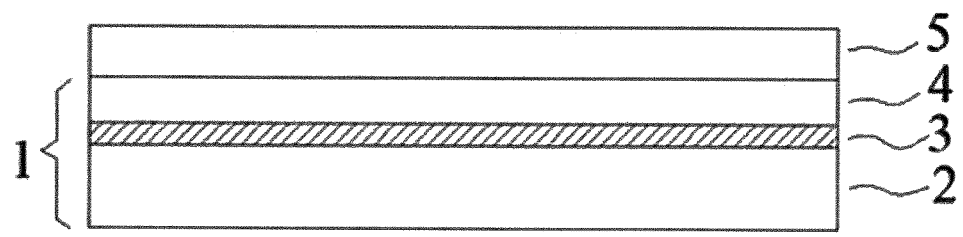
FIG. 4 is a schematic cross-sectional illustration of an epitaxial layer formed on the semiconductor substrate, in accordance with an embodiment of the present disclosure.

In an embodiment in which the semiconductor substrate is 2" 6H poly type (0001) SiC substrate, protons may be implanted into the substrate at an incline of approximately 7° to the surface. The energy and dose of implanted protons may be 500 keV and $7 \times 10^{16}$ cm$^{-2}$, respectively. The protons cause an ion damage layer in the semiconductor substrate as illustrated in FIG. 3. The ion implanted SiC substrates are placed into MOCVD reactors for epitaxial semiconductor layers (function layer in this case) as illustrated in FIG. 4. The epitaxial semiconductor layers 51-54, from bottom to top, are AlN buffer layer, Si doped n-type GaN, multiple quantum wells $In_xGa_{1-x}N$ and barriers GaN, and Mg doped p-type GaN, respectively. The total thickness of the epitaxial layer 5 in this embodiment is approximately 4 μm. A Si substrate may be glued to the functional layer. Two vacuum chucks are attached to the SiC substrate and silicon substrate, respectively. The two vacuum chucks are pulled in opposite directions to separate the functional layer and the substrate film from the main body 2 of semiconductor substrate 1.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the disclosure is anticipated to hold on to all other such alternatives, modifications, and variations that fall within the scope of the present disclosure and appended claim.

The invention claimed is:
1. A method for separating a main body of a semiconductor substrate from a functional layer, the method comprising the steps of:
   implanting ions into a semiconductor substrate through a top surface of the semiconductor substrate, the implanted ions located at a depth in the range from 0.1 μm-100 μm underneath the top surface of the semiconductor substrate, to form an ion damage layer in the semiconductor substrate, wherein the ion damage layer is located over the main body of the semiconductor substrate;

forming a functional layer on the top surface of the semiconductor substrate after the ions are implanted into the semiconductor substrate;

forming a stress inducing layer on the functional layer, the stress inducing layer being tensile stressed and introducing compressive stress to the functional layer; and separating the functional layer from the main body of the semiconductor substrate at the ion damage layer.

2. The method of claim 1, wherein the semiconductor substrate comprises one of the following: a mono-crystalline semiconductor, an epitaxial semiconductor layer deposited on a mono crystalline semiconductor, and an epitaxial semiconductor layer deposited on a mono crystalline oxide.

3. The method of claim 1, wherein the semiconductor substrate materials comprise at least one of the following: Si, Ge, $Si_xGe_{1-x}$, SiC, GaAs, InP, $In_xGa_{1-x}P$, $In_xGa_{1-x}As$, CaTe, AlN, GaN, InN, and $Al_xIn_yGa_{1-x-y}N$, wherein $0 \leq x \leq 1$, $0 \leq y \leq 1$, and $0 \leq 1-x-y \leq 1$.

4. The method of claim 1, wherein forming the functional layer comprises one of the following: fabricating electronic devices directly on the top surface of the semiconductor substrate, depositing an epitaxial semiconductor layer on the top surface of the semiconductor substrate, and depositing an epitaxial semiconductor layer on the top surface of the semiconductor substrate followed by fabricating electronic devices on the epitaxial semiconductor layer.

5. The method of claim 4, wherein the epitaxial semiconductor layer composition comprises at least one of the following: Si, Ge, $Si_xGe_{1-}$, SiC, GaAs, InP, $In_xGa_{1-x}P$, $In_xGa_{1-x}As$, CaTe, AlN, GaN, InN, and $Al_xIn_yGa_{1-x-y}N$, wherein $0 \leq x \leq 1$, $0 \leq y \leq 1$, and $0 \leq 1-x-y \leq 1$.

6. The method of claim 5, wherein x and y varies within the epitaxial semiconductor layer of $Al_xIn_yGa_{1-x-y}N$.

7. The method of claim 2, further comprising depositing the epitaxial semiconductor layer by one of the following: CVD, PECVD, MOCVD, MBE, HVPE, PVT, and LPE.

8. The method of claim 4, further comprising depositing the epitaxial semiconductor layer by one of the following: CVD, PECVD, MOCVD, MBE, HVPE, PVT, and LPE.

9. The method of claim 1 wherein the ions implanted into the semiconductor substrate comprise at least one of the following: H, He, Ar, Ne and the gas ions thereof.

10. The method of claim 1, wherein the stress inducing layer is composed of metal material comprising at least one of the following: Ni, Au, Cu, Pd, Ag, Al, Sn, Cr, Ti, Mn, Co, Zn, Mo, W, Zr, V, Ir, Pt, and Fe.

11. The method of claim 1, wherein the stress inducing layer comprises a polymer.

12. The method of claim 1, wherein the stress inducing layer functions as an Ohmic contact layer or a Schottky contact layer when the stress inducing layer is metallic.

13. The method of claim 1, further comprising forming a supporting layer on the stress inducing layer.

14. The method of claim 13, wherein the supporting layer comprises soft material or stiff material.

15. A method for preparing a main body of a semiconductor substrate to be separated from a functional layer, the method comprising the steps of:

receiving a semiconductor substrate that has been ion-implanted through a top surface of the semiconductor substrate, the implanted ions located at a depth in the range from 0.1 µm-100 µm underneath the top surface of the semiconductor substrate, the implanted ions forming an ion damage layer in the semiconductor substrate, wherein the ion damage layer is located over the main body of the semiconductor substrate;

forming a functional layer on the top surface of the semiconductor substrate after the ions are implanted into the semiconductor substrate; and forming a stress inducing layer on the functional layer, the stress inducing layer being tensile stressed and introducing compressive stress to the functional layer;

whereby the functional layer is able to be more easily separated from the main body of the semiconductor substrate at the ion damage layer.

16. A method for preparing a main body of a semiconductor substrate to be separated from a functional layer, the method comprising the steps of:

receiving a semiconductor substrate that has been ion-implanted through a top surface of the semiconductor substrate, the implanted ions located at a depth in the range from 0.1 µm-100 µm underneath the top surface of the semiconductor substrate, the implanted ions forming an ion damage layer in the semiconductor substrate, wherein the ion damage layer is located over the main body of the semiconductor substrate, and wherein the semiconductor substrate further has had a functional layer formed on the top surface thereof subsequent to the ions being implanted into the semiconductor substrate; and forming a stress inducing layer on the functional layer, the stress inducing layer being tensile stressed and introducing compressive stress to the functional layer;

whereby the functional layer is able to be more easily separated from the main body of the semiconductor substrate at the ion damage layer.

17. The method of claim 16, further comprising forming one or more devices on the top surface of the functional layer.

18. A method for preparing a main body of a semiconductor substrate to be separated from a functional layer, the method comprising the steps of:

implanting ions into a semiconductor substrate through a top surface of the semiconductor substrate, the implanted ions located at a depth in the range from 0.1 µm-100 µm underneath the top surface of the semiconductor substrate, to form an ion damage layer in the semiconductor substrate, wherein the ion damage layer is located over the main body of the semiconductor substrate;

forming a functional layer on the top surface of the semiconductor substrate after the ions are implanted into the semiconductor substrate; and forming a stress inducing layer on the functional layer, the stress inducing layer being tensile stressed and introducing compressive stress to the functional layer;

whereby the functional layer is able to be more easily separated from the main body of the semiconductor substrate at the ion damage layer.

* * * * *

UNITED STATES PATENT AND TRADEMARK OFFICE
CERTIFICATE OF CORRECTION

PATENT NO. : 10,734,274 B2
APPLICATION NO. : 15/868300
DATED : August 4, 2020
INVENTOR(S) : Bing Hu Page 1 of 1

It is certified that error appears in the above-identified patent and that said Letters Patent is hereby corrected as shown below:

In the Claims

Column 9, Line 33, Claim 5, the formula reading 'Si$_x$Ge$_1$-' should read --Si$_x$Ge$_{1-x}$--.

Signed and Sealed this
Sixth Day of October, 2020

Andrei Iancu
*Director of the United States Patent and Trademark Office*